United States Patent
Kirisawa

(10) Patent No.: US 7,706,762 B2
(45) Date of Patent: Apr. 27, 2010

(54) SIGNAL PROCESSING CIRCUIT AND SIGNAL PROCESSING METHOD

(75) Inventor: Akihiro Kirisawa, Tokyo (JP)

(73) Assignee: NEC Corporation, Tokyo (JP)

(*) Notice: Subject to any disclaimer, the term of this patent is extended or adjusted under 35 U.S.C. 154(b) by 521 days.

(21) Appl. No.: 11/731,491

(22) Filed: Mar. 30, 2007

(65) Prior Publication Data

US 2007/0243846 A1    Oct. 18, 2007

(30) Foreign Application Priority Data

Apr. 13, 2006   (JP)   ............... 2006-110883

(51) Int. Cl.
*H01Q 11/12*   (2006.01)
*H04B 1/04*   (2006.01)

(52) U.S. Cl. ............... 455/127.2; 455/127.3; 455/522; 455/63.1; 455/67.11; 455/67.13; 455/115.1

(58) Field of Classification Search ............ 455/67.11, 455/67.13, 115.1, 127.1–127.3, 226.1, 234.1–234.2, 455/245.1–245.2, 63.1, 522, 232.1
See application file for complete search history.

(56) References Cited

U.S. PATENT DOCUMENTS

2003/0153287 A1* 8/2003 Kuiri .................... 455/127

2006/0160506 A1* 7/2006 Smentek et al. .......... 455/127.3

FOREIGN PATENT DOCUMENTS

JP   11068485   * 3/1999
JP   2000-244353   9/2000

* cited by examiner

Primary Examiner—Tuan A Tran
(74) Attorney, Agent, or Firm—Katten Muchin Rosenman LLP

(57) ABSTRACT

An objective of this invention is to obtain a signal processing circuit and a signal processing method that reduce temperature-induced distortion when inputting a signal to a mixer and changing the frequency of the signal to a desired frequency. If a sensing result from a temperature sensor 133 is lower than a predetermined temperature, the attenuation factor of a first variable attenuator 102 is large while the attenuation factor of a second variable attenuator 108 is small. The magnitude relationship between the attenuation factors is reversed in a temperature range of the predetermined temperature or more. In a mixer 104 in which at a low temperature, the gain increases, and distortion increases, an increase in IM3 distortion can be prevented by increasing the attenuation factor at a low temperature. The same applies to a case where a mixer that has an amplifier arranged at a preceding stage thereof and makes the amplification factor of the amplifier large at a low temperature is used. An amplification factor may be adjusted instead of an attenuation factor.

10 Claims, 8 Drawing Sheets

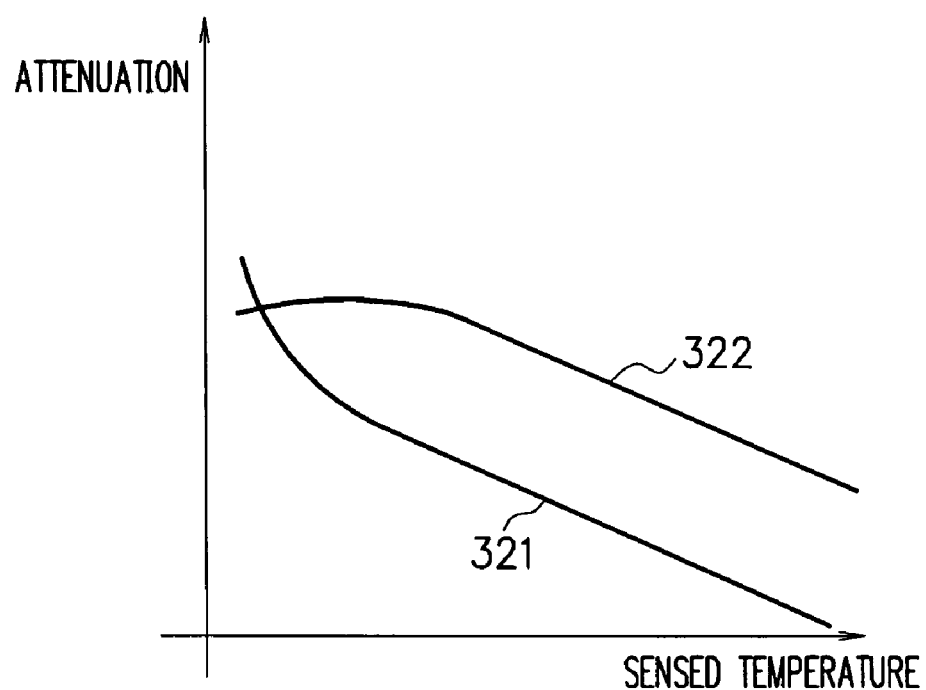

SIGNAL PROCESSING CIRCUIT AND SIGNAL PROCESSING METHOD

BACKGROUND OF THE INVENTION

1. Field of the Invention

The present invention relates to a signal processing circuit and a signal processing method that use a mixer that generates an intermediate frequency and, more particularly, to a signal processing circuit and a signal processing method that are suitable for use in a transmitting circuit or receiving circuit constituting a communication device such as a wireless access device, and are designed to eliminate distortion in a signal to be processed.

2. Description of Related Art

A transmitting circuit that inputs a local signal output from a local oscillator to a mixer, up-converts a transmission signal to a desired frequency, and transmits the transmission signal is generally used in a transmitter. Since the mixer used to generate an intermediate frequency is a non-linear circuit, IM (Inter Modulation) 3, which is the third order distortion, occurs in an input signal. For this reason, the transmitting circuit generally has a variable amplifier provided at a preceding stage of the mixer and is designed to prevent an input to the mixer from becoming excessive (see, e.g., Japanese Patent Laid Open Publication No. 2000-244353 (Paragraphs 0020 to 0023 and FIG. 1)). More specifically, to prevent occurrence of distortion caused by an excessive input to the mixer, the amplification factor of the variable amplifier is controlled.

The mixer causes distortion not only upon receipt of such an excessive input but also at a low temperature. Accordingly, when the transmitting circuit is used over a wide range of temperatures, distortion in the mixer at a low temperature is a problem. At a low temperature, the characteristics of the mixer degrade, and IM3 degrades a circuit output.

FIG. 1 represents the main portion of an example of a conventional transmitting circuit. A transmitting circuit 500 includes a mixer 502 for inputting and up-converting a transmission signal 501. A local signal 504, an oscillation frequency of a local oscillator 503, is input to the mixer 502. A transmission signal 505 which is obtained after the mixer 502 up-converts the transmission signal 501 is attenuated at a variable attenuator 506. A transmission signal 507 obtained after the attenuation is amplified by an amplifier 508 and then input to a directional coupler 509.

The directional coupler 509 sends a transmission signal 511 which has been branched off from the input signal to a detector 512. A detection output 513 from the detector 512 is input to a low-pass filter 514, and an output 515 from the low-pass filter 514 is input to an operational amplifier 517 through a first resistor 516. An output 518 from the operational amplifier 517 controls the variable attenuator 506.

The operational amplifier 517 has a plus (+) input terminal connected to ground and a minus (−) input terminal connected to one end of the first resistor 516. A second resistor 519 for feedback which determines the gain is connected between the minus input terminal and an output terminal of the operational amplifier 517.

In order to keep an original transmission output 521 from the directional coupler 509 around a fixed value regardless of temperature, this conventional transmitting circuit 500 causes the transmission signal 511 to branch off, detects the signal level with the detector 512, and feeds back, to the variable attenuator 506, the detection result as the output 518 from the operational amplifier 517. If the transmission output 521 from the transmitting circuit 500 decreases, the output 518 changes to reduce the attenuation of the variable attenuator 506. On the other hand, if the transmission output 521 from the transmitting circuit 500 increases, the output 518 changes to increase the attenuation of the variable attenuator 506.

However, in the conventional transmitting circuit 500 shown in FIG. 1, when the environmental temperature becomes low, distortion in the mixer 502 increases, and the quality of the transmission output 521 degrades. To cope with this, there has been devised a method of equally suppressing the signal level of the transmission signal 501 regardless of temperature. However, since the signal level of the local signal 504 outputted from the local oscillator 503 is constant, this method relatively increases the proportion of local leakage to degrade the transmission output 521. If the gain of the amplifier 508 decreases at a high temperature, the gain of the transmission output 521 becomes insufficient while the signal level of the transmission signal 501 is kept low.

The problem of temperature-induced distortion in a transmitting circuit has been introduced. A receiving circuit that uses a mixer suffers similar problems.

SUMMARY OF THE INVENTION

The present invention's objective is to provide a signal processing circuit that reduces temperature-induced distortion when a signal is inputted to a mixer and the frequency of the signal is changed to a desired frequency.

A signal processing circuit comprises (a) an oscillator, (b) a mixer which changes a frequency of an input signal by mixing the input signal with an output from the oscillator, (c) a temperature sensing section that senses a temperature of the mixer, and (d) a signal level adjustment section that is arranged at a preceding stage of the mixer and makes a signal level of the input signal lower in a predetermined temperature region where distortion in the mixer increases compared with a region other than the predetermined temperature region, according to a sensing result from the temperature sensing section.

In other words, the temperature of the mixer is sensed, and the level of the input signal is made lower in the predetermined temperature region (where distortion in the mixer increases) than in the region other than the predetermined temperature region. This makes it possible to effectively eliminate distortion in the mixer. However, the rate of signal level decrease differs according to temperature. If this is inconvenient, the signal processing circuit may comprise a signal level additional adjustment section at a subsequent stage of the mixer to perform reverse level adjustment.

A signal processing method comprises (a) a temperature measurement step of measuring a temperature of a mixer for changing a frequency of an input signal by mixing the input signal with an output from an oscillator, (b) a temperature region determination step of determining whether the temperature of the mixer measured in the temperature measurement step is within a predetermined temperature region where distortion in the mixer increases, (c) a first attenuation factor control step of making an attenuation factor of a first attenuator arranged at a preceding stage of the mixer larger if the temperature is within the predetermined temperature region than the other cases, and (d) a second attenuation factor control step of making an attenuation factor of a second attenuator arranged at a subsequent stage of the mixer smaller if the temperature is within the predetermined temperature region than the other cases.

In other words, the temperature of the mixer is measured, and it is determined whether the temperature is within the predetermined temperature region in which distortion in the mixer increases. The attenuation factor of the first attenuator arranged at the preceding stage of the mixer is made larger if the temperature is within the predetermined temperature region in which distortion in the mixer increases than the other cases. The attenuation factor of the second attenuator arranged at the subsequent stage of the mixer is made smaller if the temperature is within the predetermined temperature range than the other cases. This configuration achieves constancy of the overall attenuation factor over the whole range of temperatures.

BRIEF DESCRIPTION OF THE DRAWINGS

The objectives and features of the present invention will become more apparent from the consideration of the following detailed description taken in conjunction with the accompanying drawings, in which:

FIG. 9 is a graph for explaining a ROM table for controlling attenuations.

DESCRIPTION OF THE PREFERRED EMBODIMENTS

Preferred embodiments will be explained in detail below.

First Embodiment

Figure 1:
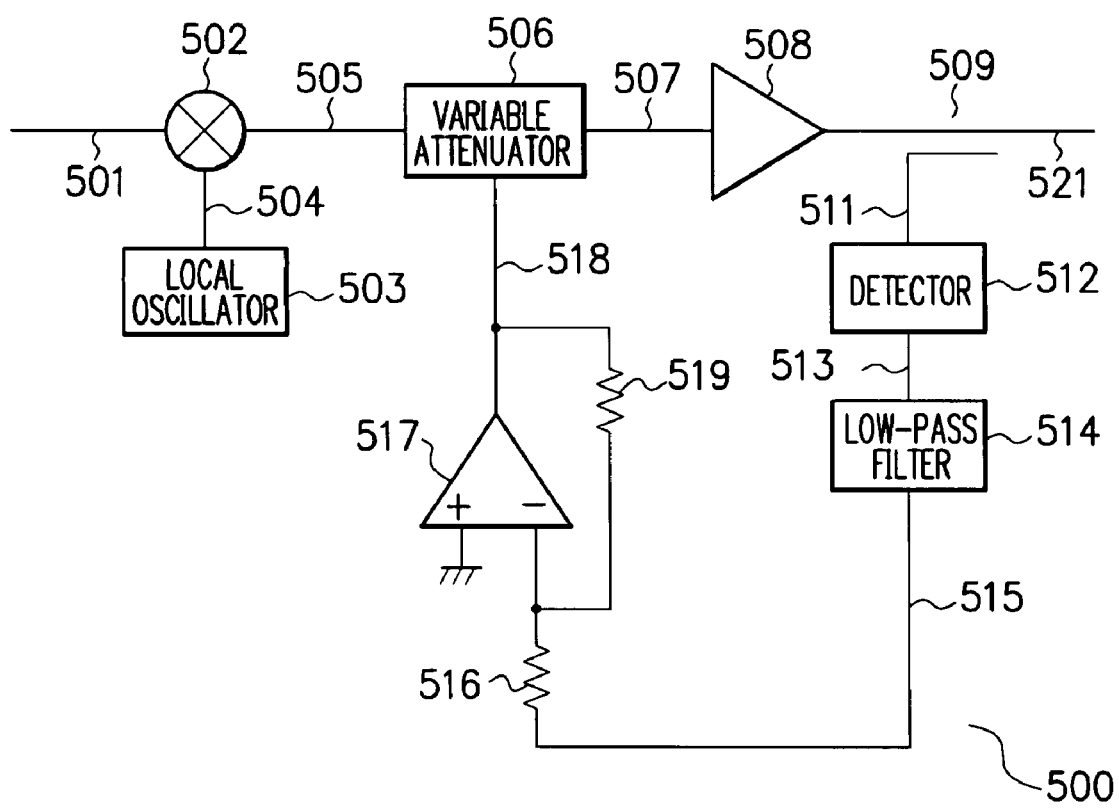
FIG. 1 is a block diagram representing the main portion of an example of a conventional transmitting circuit.
Figure 2:
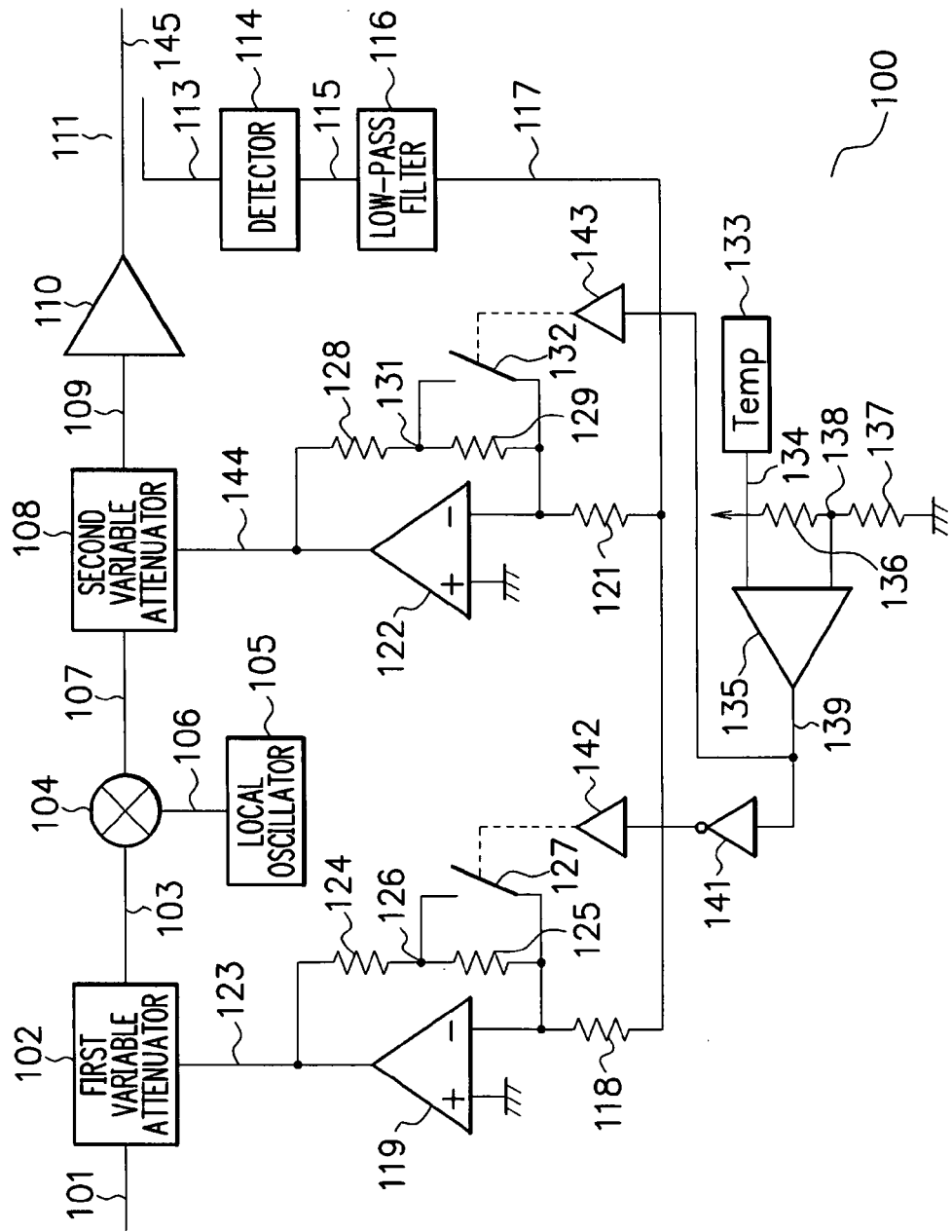
FIG. 2 is a block diagram showing the main portion of a transmitting circuit.

FIG. 2 represents the configuration of the main portion of a transmitting circuit. The transmitting circuit 100 includes a first variable attenuator (ATT) 102 to which a transmission signal 101 is input. A transmission signal 103 that is obtained after the first variable attenuator 102 attenuates the transmission signal 101 based on temperature is input to a mixer 104, mixed with a local signal 106, an oscillation frequency of a local oscillator 105, and up-converted to a desired frequency. A transmission signal 107 that is obtained after the mixer 104 up-converts the transmission signal 103 passes through a second variable attenuator 108 where the signal 103 is attenuated depending on temperature. A transmission signal 109 obtained after the attenuated signal is amplified by an amplifier 110 and then input to a directional coupler 111. Note that the mixer 104 of this embodiment has the characteristic that at a low temperature, the gain increases, and distortion increases.

The directional coupler 111 outputs a branched transmission signal 113 to a detector 114. A detection output 115 from the detector 114 is input to a low-pass filter 116, and an output 117 from the low-pass filter 116 is input to a first operational amplifier 119 through a first resistor 118 and to a second operational amplifier 122 through a second resistor 121. An output 123 from the first operational amplifier 119 acts as a control signal for the first variable attenuator 102.

The first operational amplifier 119 has a plus input terminal connected to ground and a minus input terminal connected to one end of the first resistor 118. A series circuit composed of third and fourth resistors 124 and 125 for determining the gain is connected between the minus input terminal and an output terminal of the first operational amplifier 119. A first semiconductor switch 127 is connected between a voltage dividing point 126 of the series circuit and the one end of the first resistor 118. Similarly, the second operational amplifier 122 has a plus input terminal connected to ground and a minus input terminal connected to one end of the second resistor 121. A series circuit composed of fifth and sixth resistors 128 and 129 for determining the gain is connected between the minus input terminal and an output terminal of the second operational amplifier 122. A second semiconductor switch 132 is connected between a voltage dividing point 131 of the series circuit and the one end of the second resistor 121.

A temperature sensor (Temp) 133 in IC (Integrated Circuit) form is disposed in the transmitting circuit 100 for detecting temperature. Temperature sensors like the temperature sensor 133 are commercially available from a plurality of manufacturers. A sensing output 134 from the temperature sensor 133 is input to a comparative input terminal of a comparator 135.

The voltage at a voltage dividing point 138 of a series circuit composed of seventh and eighth resistors 136 and 137 that has one end connected to a predetermined constant voltage power supply line and the other end connected to ground is input to a reference voltage input terminal of the comparator 135. A comparison result 139 from the comparator 135 is logically inverted through an inverter 141, input to a first internal control circuit 142 that, when combined with the first semiconductor switch 127, constitutes an analog switch, and is used to control the first semiconductor switch 127. The comparison result 139 is also input to a second internal control circuit 143 that, when combined with the second semiconductor switch 132, constitutes an analog switch and is used to control the second semiconductor switch 132. An output 144 from the second operational amplifier 122 acts as a control signal for the second variable attenuator 108.

The operation of the transmitting circuit 100 with the above-described configuration will be explained next. The transmitting circuit 100 is used to change the frequency of a modulated wave signal of an IF (Intermediate Frequency) band from a modulator (MODEM) (not shown) to a desired radio frequency and amplify the resultant signal to a desired transmission output. The transmission signal 101 inputted to the transmitting circuit 100 is attenuated by the first variable attenuator 102 and inputted to the mixer 104. In the mixer 104, the input signal is mixed with the local signal 106 of the local oscillator 105 and up-converted to a desired frequency.

Since the mixer 104 is a non-linear circuit, distortion occurs at the time of the up-conversion. IM3 (two-tone third order intermodulation distortion), which is a third order distortion, is generally proportional to an input level, with a proportionality constant of two. IM3 is a distortion component that occurs at frequencies very close to two frequencies $f_1$ and $f_2$ as a result of occurrence of the two frequency components ($2f_1-f_2$ and $2f_2-f_1$) from second order harmonics $f_1 \times 2$ and $f_2 \times 2$ caused by the non-linearity of the mixer and the two fundamental frequencies $f_1$ and $f_2$ when signals with the two frequencies $f_1$ and $f_2$ are inputted to a device such as the mixer 104.

Since an input level and IM3 have the above-described proportional relationship, the amount of IM3 distortion decreases as an input level decreases. However, the level of the local signal 106 inputted to the mixer 104 does not change. Accordingly, the percentage of the signal 106 that leaks from the mixer 104 in the up-converted signal 107 becomes higher as the input level of the transmission signal 103 to the mixer 104 lowers. Consequently, the transmission signal 107 degrades.

Temperature also causes a change in the characteristics of IM3 in the mixer 104. If the mixer 104 is a mixer having an amplifying effect or a mixer having an amplifier at a preceding stage, the gain and distortion increase with a reduction in temperature.

Figure 3:
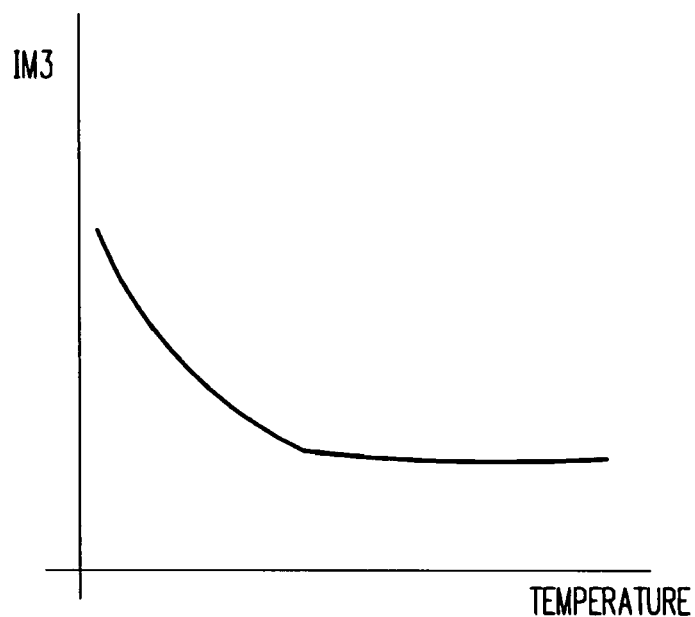
FIG. 3 is a graph representing the relationship between IM3 and temperature.

FIG. 3 represents the relationship between IM3 and temperature. It is apparent from FIG. 3 that when the temperature drops to a predetermined temperature or less, IM3 distortion increases.

Referring back to FIG. 2, an explanation of the operation will be continued. The transmission signal 107, which is obtained after the input signal passes through the mixer 104 and is up-converted, goes into the second variable attenuator 108, where the signal is attenuated and then amplified to a desired output level by the amplifier 110. The amplified signal is output to the outside via the directional coupler 111. The transmission signal 113, which is a part of the transmission output from the directional coupler 111, is taken out by the directional coupler 111 and inputted to the detector 114.

The detector 114 detects the input signal, thereby outputting a voltage corresponding to a transmission output level as a detection output 115. The detection output 115 passes through the low-pass filter 116, is inputted as the output 117 to the first operational amplifier 119 through the first resistor 118 and to the second operational amplifier 122 through the second resistor 121, and amplified. The amplified result is input to the first variable attenuator 102 and the second variable attenuator 108. The series of circuits explained above constitute feedback loops. For this reason, the signal level of a transmission signal 145 outputted from the directional coupler 111 to the outside is controlled to be always constant regardless of temperature.

The sensing output 134 from the temperature sensor 133 will be explained. The sensing output 134 is input to one input terminal of the comparator 135. The voltage at the voltage, dividing point 138 of the seventh and eighth resistors 136 and 137 is input to the other input terminal of the comparator 135. The comparator 135 compares the sensing output 134 with the voltage at the voltage dividing point 138. The comparison result 139 changes to a high level or a low level depending on whether the sensing output 134 is not less than or less than the voltage at the voltage dividing point 138. The comparison result 139 is input to the first operational amplifier 119 and the second operational amplifier 122 to switch the attenuations of the first and second variable attenuators 102 and 108.

Figure 4:
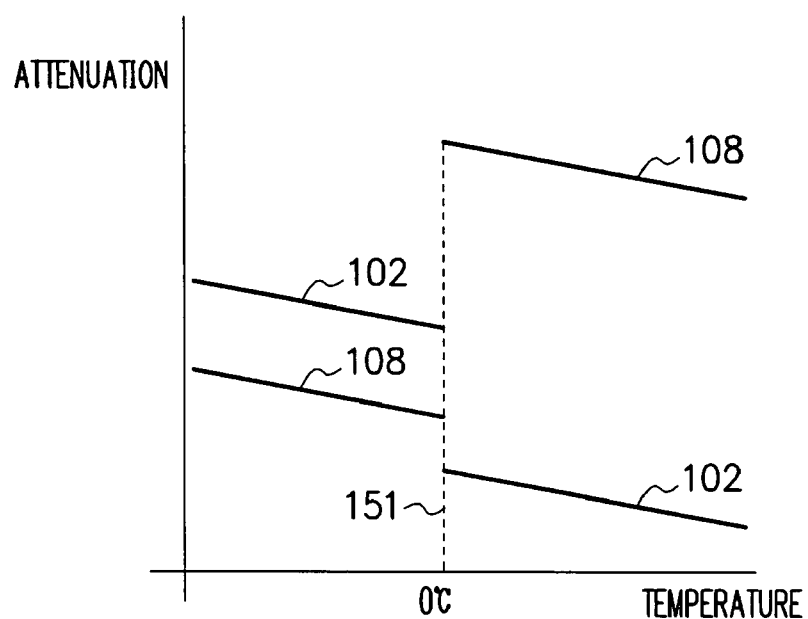
FIG. 4 is an explanatory graph representing how the attenuations of a first variable attenuator and a second variable attenuator switch.

FIG. 4 represents how the attenuations of the first variable attenuator and second variable attenuator switch. In FIG. 4, the ordinate represents attenuation (ATT), and the abscissa represents temperature. In this embodiment, assume that the comparator 135 shown in FIG. 2 switches the logic level of the comparison result 139 at a temperature of 0° C. In a region on the right side of a broken line 151 in FIG. 4, the region for temperatures higher than 0° C., attenuations of the first variable attenuator 102 and those of the second variable attenuator 108 at the temperatures converge on two predetermined constant values, respectively. Strictly, each attenuation deviates from the value of convergence due to a gain change that occurs according to temperature. Accordingly, the half line representing the relationship of the attenuation of each of the first and second variable attenuators 102 and 108 with temperature has a downward slope, as shown on the right side of the broken line 151 in FIG. 4.

If the temperature around the transmitting circuit 100 becomes low, and the temperature sensor 133 detects a temperature of 0° C. or less, the sensing output 134 changes and the comparison result 139 of the comparator 135 changes from a low level to a high level. This causes the second internal control circuit 143 to turn on the second semiconductor switch 132 and to reduce the resistance of the feedback resistor of the second operational amplifier 122 to the value of the fifth resistor 128. A change in the output 144 from the second operational amplifier 122 due to the reduction causes the second variable attenuator 108 to reduce its attenuation. Attenuations converge on a predetermined value (see FIG. 4) lower than the value of convergence for temperatures higher than 0° C.

If the temperature sensor 133 senses a temperature of 0° C. or less, and the comparison result 139 of the comparator 135 changes to a high level, the first internal control circuit 142 receives a signal at a low level that is obtained after the inverter 141 inverts the logic of the comparison result 139. Accordingly, the first semiconductor switch 127 is turned off, as shown in FIG. 4, and the resistance of the feedback resistor of the first operational amplifier 119 becomes equal to the sum of the resistances of the third and fourth resistors 124 and 125. Since this causes a change in the output 123 from the first operational amplifier 119, the first variable attenuator 102 increases an amount of attenuation. Attenuations converge on a predetermined value (see FIG. 4) higher than the value of convergence for temperatures higher than 0° C.

Note that in these cases as well where the temperature changes to 0° C. or less, each attenuation deviates from the corresponding value of convergence due to a gain change that occurs according to temperature. For this reason, the line segment representing the relationship of the attenuation of each of the first variable attenuator 102 and second variable attenuator 108 with temperature has a downward slope, as shown on the left side of the broken line 151 in FIG. 4.

As described above, control is performed at a temperature higher than 0° C., a control reference temperature, such that the attenuation of the first variable attenuator 102 becomes low and that the attenuation of the second variable attenuator 108 becomes high. On the other hand, control is performed at a temperature of 0° C. or less such that the attenuation of the first variable attenuator 102 becomes high and that the attenuation of the second variable attenuator 108 becomes low. Since the attenuations of the first and second variable attenuators change complementarily to each other according to temperature, the overall attenuation does not change significantly over a wide range of temperatures. Additionally, at a low temperature (a temperature of 0° C. or less in this example, although this embodiment need not be restricted to this temperature), IM3 distortion is reduced by reducing the level of the transmission signal 103 inputted to the mixer 104. In this way, constancy of IM3 over a wide range of temperatures is achieved.

Figure 5:
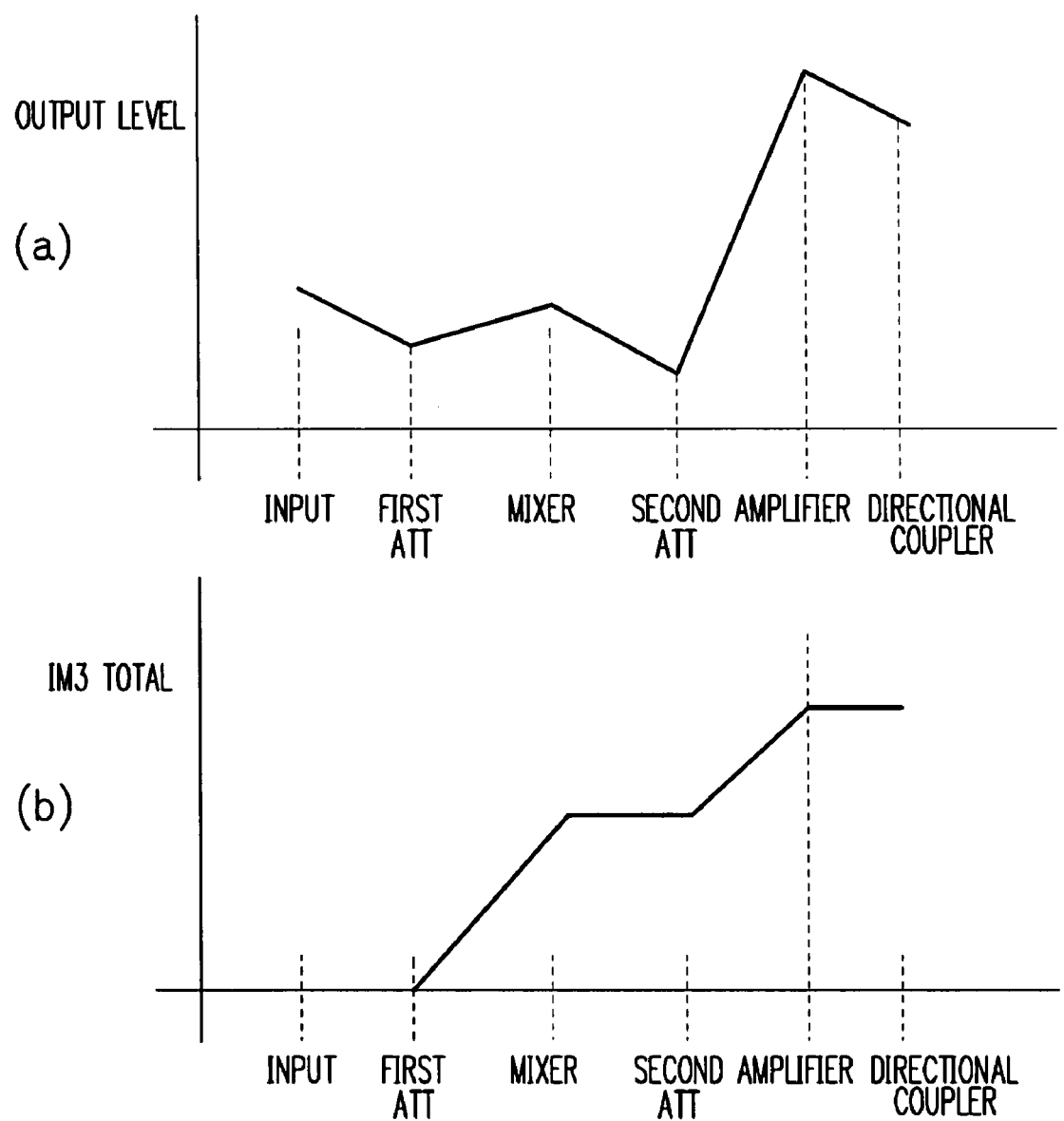
FIGS. 5(A) and 5(B) are graphs each showing a level diagram at room temperature of the transmitting circuit.

FIGS. 5(A) and 5(B) show level diagrams of the transmitting circuit of this embodiment. FIG. 5(A) shows how the level of a signal inputted to the transmitting circuit 100 shown in FIG. 2 changes while the signal goes through the circuitry (the circuit 100). FIG. 5(B) shows how the total amount of IM3 changes while the signal goes through the circuitry, and corresponds to FIG. 5(A). FIG. 5(A) shows the signal level at each component of the circuitry at room temperature, i.e., 0° C. or more in this embodiment.

Figure 6:
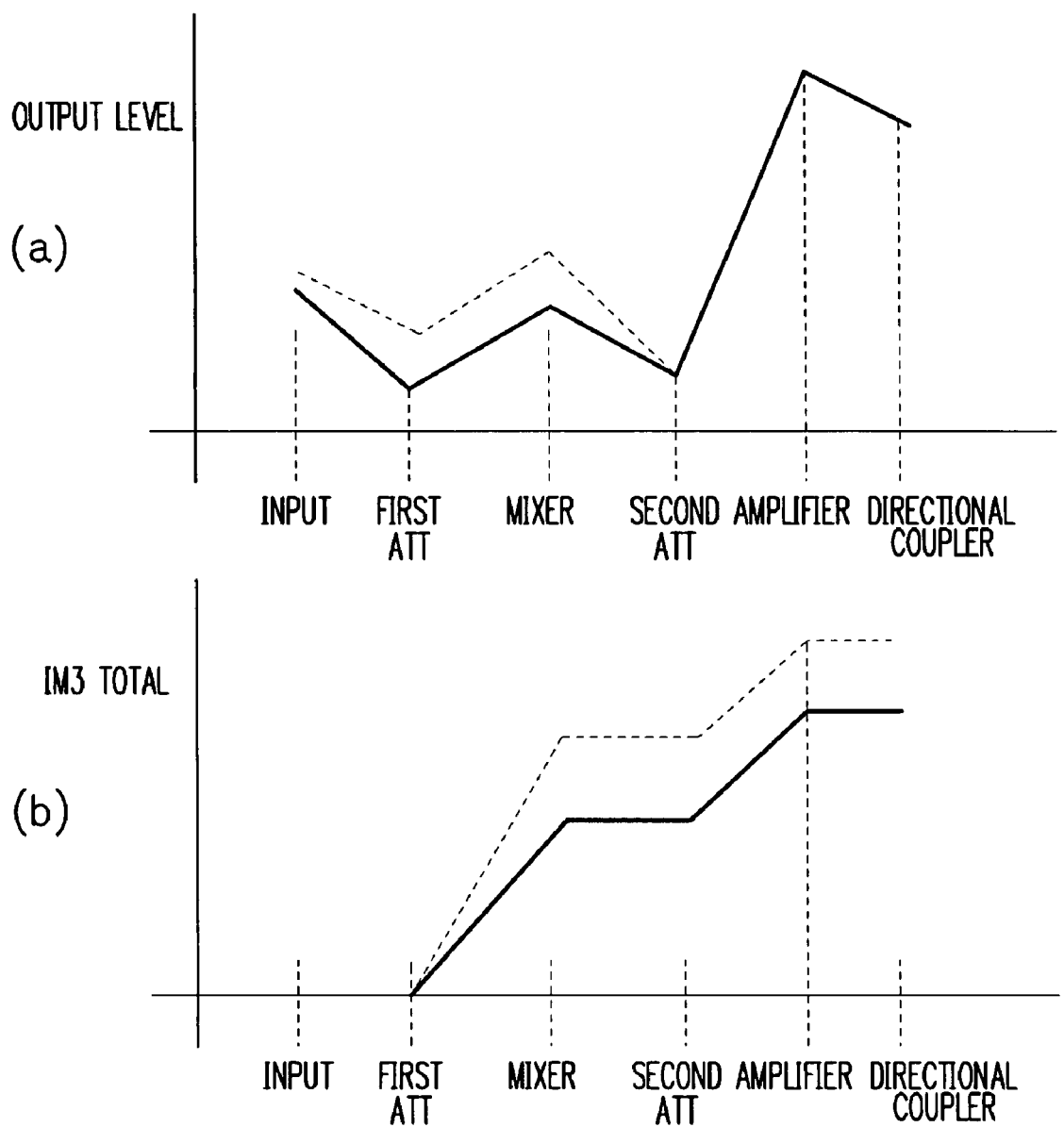
FIGS. 6(A) and 6(B) are graphs each showing a level diagram at a low temperature of the transmitting circuit.

FIGS. 6(A) and 6(B) show level diagrams at a low temperature of the transmitting circuit of this embodiment and those of a conventional transmitting circuit, in contrast with each other. FIG. 6(A) shows how the level of a signal inputted to the transmitting circuit 100 shown in FIG. 2 changes while the signal goes through the circuitry. FIG. 6(B) shows how the total amount of IM3 changes while the signal goes through the circuitry, and corresponds to FIG. 6(A). Each solid line indicates a characteristic of the transmitting circuit 100 of this embodiment while each broken line indicates a characteristic of a conventional transmitting circuit without correction at a low temperature.

When the conventional transmitting circuit is used, control that changes the attenuation of the transmission signal 101 is not performed at the preceding stage of the mixer 104. For this reason, the signal level at a low temperature indicated by the broken line becomes higher than that of this embodiment indicated by the solid line. That is, in the conventional transmitting circuit, as a result of a signal at a high level inputted to the mixer 104 at a low temperature, the total amount of IM3 increases, as shown in FIG. 6(B).

In contrast with this, in the transmitting circuit 100 of this embodiment, the attenuation of the first variable attenuator 102 at the pre-stage of the mixer 104 becomes relatively high at a low temperature, as shown in FIG. 4, and thus, the output level at a low temperature is made lower than the conventional transmitting circuit. For this reason, in this embodiment, an excessive input of the transmission signal 103 to the mixer 104 is prevented at a low temperature. This prevents an increase of IM3 and degradation in the transmission signal 103 at a low temperature.

To minimize an increase of IM3 at a low temperature, a conventional transmitting circuit may be modified to equally suppress the level of the transmission signal 101 inputted to the mixer 104 over the whole range of temperatures. In this case, the level of the original transmission signal 101 becomes low. Accordingly, the leaking percentage of the local signal 106 increases as the signal 101 lowers whereby the transmission signal 107 deteriorates or the overall gain at room temperature becomes insufficient.

In the case of the transmitting circuit 100 of this embodiment, since the attenuation of the first variable attenuator 102 before the mixer 104 is set to be high only at a low temperature, the gain for a transmission signal is not reduced over the whole range of temperatures. It is unnecessary to set the signal level of the transmission signal 101 inputted to the mixer 104 at a low temperature to be low in advance. Accordingly, it is possible to prevent degradation in the transmission signal 107 from the mixer 104 without increasing the leaking quantity of the local signal 106 at a low temperature.

As has been explained in detail, in this embodiment, the attenuation of each variable attenuator is switched according to temperature. This makes it possible to keep a transmission output in a good quality over a wide range of temperatures without causing degradation due to distortion.

First Modified Embodiment

Figure 7:
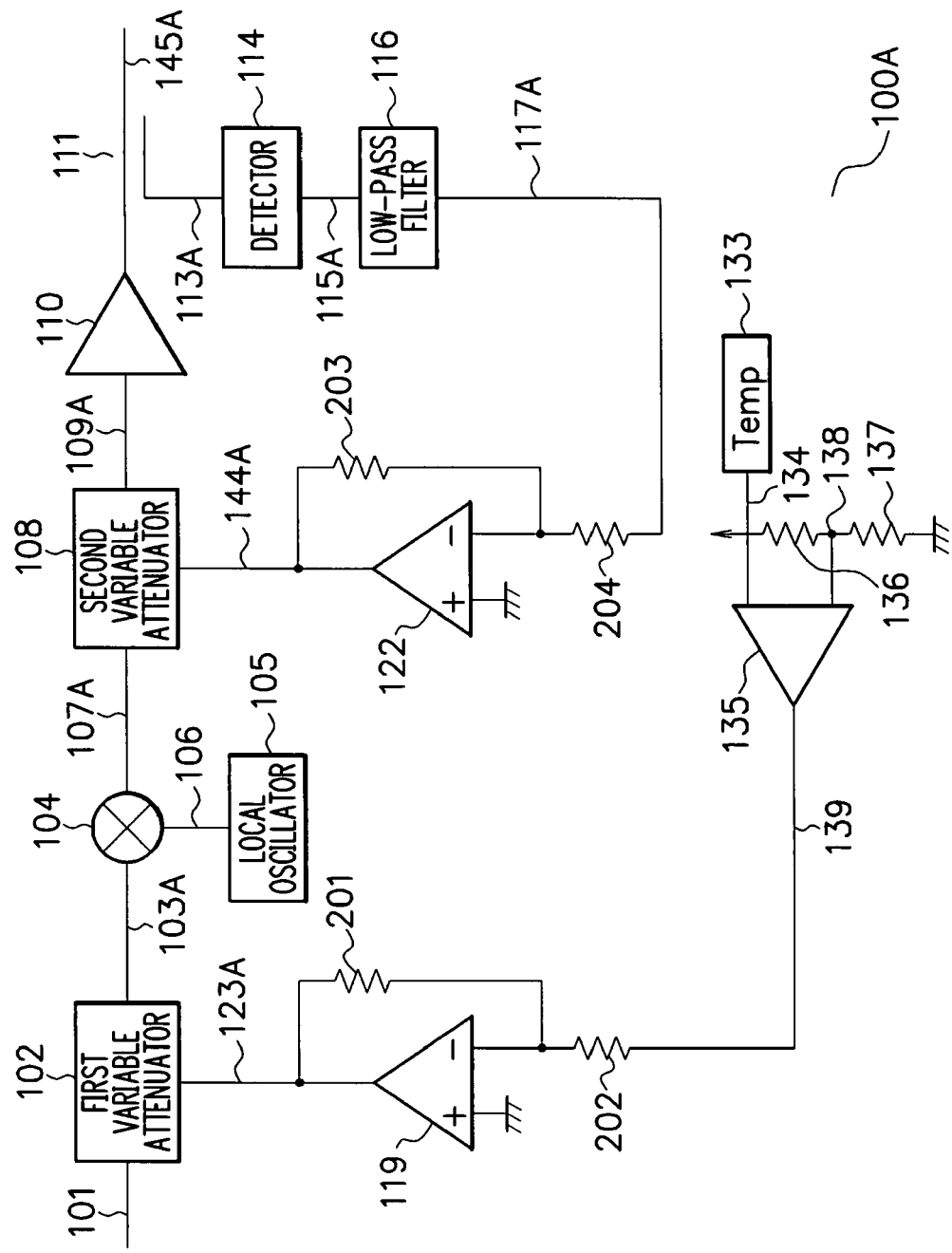
FIG. 7 is a block diagram representing a transmitting circuit.

FIG. 7 represents a transmitting circuit according to a first modified embodiment. The common components shared by FIG. 7 and FIG. 2 are given the same reference numerals, and an explanation thereof will be omitted. In a transmitting circuit 100A, two-level control of the attenuation of the first variable attenuator 102 using an output 123A from the first operational amplifier 119 is implemented by inputting the comparison result 139 from the comparator 135 to a minus (−) input terminal of the first operational amplifier 119, which comprises a feedback resistor 201, through an 11th resistor 202.

An output 144A from the second operational amplifier 122 for controlling the attenuation of the second variable attenuator 108 is obtained from an output 117A from the low-pass filter 116. More specifically, the output 117A from the low-pass filter 116 is input to a minus (−) input terminal of the second operational amplifier 122 through a 12th resistor 204. A feedback resistor 203 is connected to the amplifier 122.

The temperature sensor 133 senses the temperature of the mixer 104, and the attenuation of the first variable attenuator 102 is controlled in two levels according to the sensed temperature. Since this reduces the level of the transmission signal 103 inputted to the mixer 104 at a low temperature, an increase of IM3 can be minimized. The level of a transmission signal 145A outputted to the outside is variably controlled by adjusting the attenuation of the second variable attenuator 108 through a loop on the output side of the mixer 104. As a result, the signal level of the transmission signal 145A is kept constant.

In other words, this embodiment simplifies a control operation of the temperature sensor 133 but, as the previous embodiment, suppresses an increase of IM3 and keeps the level of the transmission signal 145A outputted from the transmitting circuit 100A at a desired level.

Second Modified Embodiment

Figure 8:
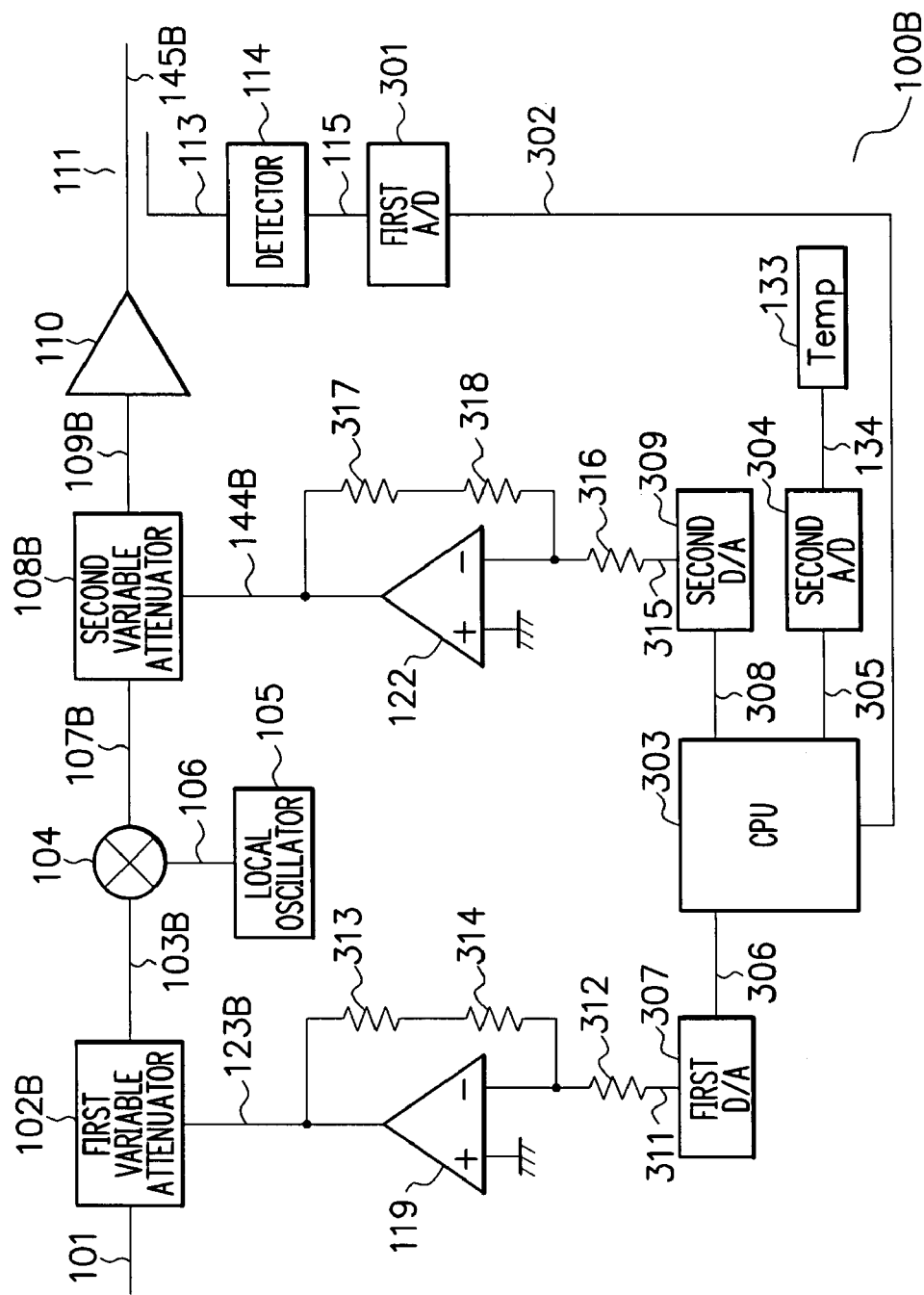
FIG. 8 is a block diagram representing a transmitting circuit.

FIG. 8 represents a transmitting circuit according to a second modified embodiment. The same portions in FIG. 8 as those in FIG. 2 are denoted by the same reference numerals, and an explanation thereof will be omitted. In a transmitting circuit 100B, signal level control is digitally performed, unlike the transmitting circuits 100 and 100A. The transmission signal 113 taken out from the directional coupler 111 is inputted to the detector 114. The analog level detection output 115 from the detector 114 is input to a first A/D converter (A/D) 301. The first A/D converter 301 converts a voltage value into a digital signal. An output 302 obtained in this manner is taken into a bus (not shown) connected to a CPU (Central Processing Unit) 303.

The sensing output 134 from the temperature sensor 133 is input to a second A/D converter 304 where the analog signal is converted into a digital signal. A temperature sensing output 305 from the second A/D converter 304 is taken into a bus connected to the CPU 303.

The CPU 303 performs computation using the input transmission output 302 and the temperature sensing output 305. The CPU 303 inputs a first variable attenuator control signal 306 for controlling the attenuation of a first variable attenuator 102B to a first D/A converter (D/A) 307 and inputs a second variable attenuator control signal 308 for controlling the attenuation of a second variable attenuator 108B to a second D/A converter 309. The CPU 303 computes the first variable attenuator control signal 306 and the second variable attenuator control signal 308 such that the voltage value (the detection output 115) from the detector 114 remains constant regardless of temperature, thereby controlling the attenuations of the first variable attenuator 102B and second variable attenuator 108B.

The first D/A converter 307 converts the first variable attenuator control signal 306, a digital signal, into a first variable attenuator control signal 311, an analog signal. The first variable attenuator control signal 311 is inputted to a minus (−) input terminal of the first operational amplifier 119 through a 21st resistor 312. The first operational amplifier 119 has a series circuit composed of 22nd and 23rd resistors 313 and 314 connected between the minus input terminal and an output terminal. Accordingly, the first variable attenuator 102B receives an output 123B corresponding to the level of the first variable attenuator control signal 306, thereby varying an amount of attenuation.

The second D/A converter 309 converts the second variable attenuator control signal 308, a digital signal, into a second variable attenuator control signal 315, an analog signal. The second variable attenuator control signal 315 is inputted to a minus input terminal of the second operational amplifier 122 through a 24th resistor 316. The second operational amplifier 122 has a series circuit composed of 25th and 26th resistors 317 and 318 connected between the minus input terminal and an output terminal. Accordingly, the second variable attenuator 108B receives an output 144B corresponding to the level of the second variable attenuator control signal 308, thereby varying an amount of attenuation.

In the transmitting circuit 100B, control signals for the first variable attenuator control signal 306 and the second variable attenuator control signal 308 are changed according to the output 134 from the temperature sensor 133. In the preceding embodiment, points of convergence for the attenuations are switched at a specific temperature of, e.g., 0° C., as shown in FIG. 4. In this embodiment, the CPU 303 computes coefficients according to temperature, and independently and successively controls an amount of attenuation of the first and second variable attenuators 102B and 108B. A ROM (Read Only Memory) table (not shown) may be prepared. Attenuation control, which differs depending on a temperature range, is implemented by inputting the temperature sensing output 305 as address information and reading out the corresponding first variable attenuator control signal 306 and the second variable attenuator control signal 308.

FIG. 9 represents the contents of the ROM table for controlling the amount of attenuations. The abscissa represents a sensed temperature, the temperature sensing output 305, and the ordinate represents the amount of attenuations for the first variable attenuator 102B and second variable attenuator 108 achieved by the first variable attenuator control signal 306 and second variable attenuator control signal 308, respectively. In FIG. 9, a curve 321 represents the operating characteristic of the first variable attenuator 102B and a curve 322 represents the operating characteristic of the second variable attenuator 108B.

According to the contents of the ROM table shown in FIG. 9, the amount of attenuation to be controlled by the first variable attenuator 102B at a low temperature increases like a quadratic function while the amount of attenuation for the second variable attenuator 108B is reduced, being inversely proportional to the attenuation for the first variable attenuator 102B. Such non-linear control of attenuations allows more accurate and sensitive control.

Further, the characteristics of the detector 114 may be corrected according to temperature. More specifically, a correction table may be prepared for the detector 114, e.g., in a ROM, in addition to the ROM table for controlling the attenuation characteristics of the first and second variable attenuators 102B and 108B. A voltage value that was corrected based on temperature is read out from the ROM, and is taken into the CPU 303. The output 302 may act as address information.

Correction of not only the temperature characteristic of the mixer 104 but also that of the detector 114, as described above, makes it possible to suppress an increase in IM3 and more precisely keep the level of the transmission signal 145B constant.

In the above description, the ROM table based on a result of measurements made in advance is used to correct the attenuations or the detection characteristic according to temperature. Alternatively, the attenuation or other kinds of correction may be computed from computing equations, a value of temperature being inputted into the equations.

In the above embodiments, the level of a signal is adjusted using an attenuator. The present invention, however, is not limited to this. In other words, the same effects can be obtained by adjusting an amplification factor in a circuit requiring amplification.

As set forth above, according to the embodiments, since the level of a signal inputted to a mixer is made lower only in a predetermined temperature range in which distortion in the mixer increases, the level of signals does not becomes insufficient in a temperature range other than the predetermined temperature range. Additionally, since it is only necessary to provide a circuit that senses a temperature and a circuit that adjusts the level of a signal inputted to the mixer, signal distortion can be eliminated over a wide range of temperatures with simple circuits.

What is claimed is:

1. A signal processing circuit comprising:
an oscillator;
a mixer that changes a frequency of an input signal by mixing the input signal with an output from the oscillator;
a temperature sensing section that senses a temperature of the mixer; and
a signal level adjustment that is arranged at a preceding stage of the mixer, and makes a level of the input signal lower in a predetermined temperature region where distortion in the mixer increases compared with a region other than the predetermined temperature region according to a sensing result from the temperature sensing section;
wherein an attenuation of the signal level adjustment is controlled according to a quadratic curve in response to a temperature fluctuation.

2. The signal processing circuit according to claim 1, comprising a signal level additional adjustment section that is arranged at a subsequent stage of the mixer and makes a level of an output signal from the mixer lower in the region other than the predetermined temperature region compared with the predetermined temperature region.

3. The signal processing circuit according to claim 2, wherein each of the signal level adjustment section and the signal level additional adjustment section is an attenuator whose attenuation factor is adjusted.

4. The signal processing circuit according to claim 2, wherein each of the signal level adjustment section and the signal level additional adjustment section is an amplifier whose amplification factor is adjusted.

5. The signal processing circuit according to claim 2, comprising an output level adjustment section that is arranged at a subsequent stage of the signal level additional adjustment section and adjusts an output level of the signal level additional adjustment section to a constant value, regardless of the sensing result from the temperature sensing section.

6. The signal processing circuit according to claim 1, wherein a signal that has undergone adjustment in the signal level adjustment section is transmitted to an outside.

7. The signal processing circuit according to claim 1, wherein the input signal is a wirelessly received signal.

8. The signal processing circuit according to claim 1, wherein the mixer has one of an amplification effect and an amplifier at a preceding stage.

9. A signal processing method comprising:

a temperature measurement step of measuring a temperature of a mixer for changing a frequency of an input signal by mixing the input signal with an output from an oscillator;

a temperature region determination step of determining whether the temperature of the mixer measured in the temperature measurement step is within a predetermined temperature region where distortion in the mixer increases;

a first attenuation factor control step of making an attenuation factor of a first attenuator arranged at a preceding stage of the mixer larger if the temperature of the mixer is within the predetermined temperature region; and a second attenuation factor control step of making an attenuation factor of a second attenuator arranged at a subsequent stage of the mixer smaller if the temperature of the mixer is within the predetermined temperature region;

wherein the first or the second attenuation factor is controlled according to a quadratic curve in response to a temperature fluctuation.

10. The signal processing method according to claim 9, comprising a signal level adjustment step of controlling a level of the input signal after control of the attenuation factor in the second attenuation factor control step to be constant.

* * * * *